United States Patent
Tsironis

(10) Patent No.: US 11,125,777 B1
(45) Date of Patent: Sep. 21, 2021

(54) SHIELDED RF AND THERMAL CONNECTION FOR ON-WAFER LOAD PULL

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 61 days.

(21) Appl. No.: 16/590,817

(22) Filed: Oct. 2, 2019

(51) Int. Cl.
*G01R 1/067* (2006.01)
*G01R 31/28* (2006.01)
*G01R 27/06* (2006.01)

(52) U.S. Cl.
CPC ..... *G01R 1/06705* (2013.01); *G01R 1/06772* (2013.01); *G01R 27/06* (2013.01); *G01R 31/2822* (2013.01); *G01R 31/2831* (2013.01); *G01R 31/2891* (2013.01)

(58) Field of Classification Search
CPC G01R 1/06705; G01R 31/2891; G01R 27/06; G01R 31/2831; G01R 1/06772; G01R 31/2822
USPC .................................................... 324/754.03
See application file for complete search history.

(56) References Cited

U.S. PATENT DOCUMENTS

| | | | |
|---|---|---|---|
| 9,335,345 B1 | 5/2016 | Tsironis | |
| 2003/0132759 A1* | 7/2003 | Tsironis | G01R 1/06772 324/601 |
| 2013/0075982 A1* | 3/2013 | Simmons | G01R 31/2601 279/3 |

OTHER PUBLICATIONS

"High-frequency Performance with Low, Stable Contact Resistance on Aluminum Pads", Infinity probe [online], FormFactor [retrieved on Sep. 25, 2019], Retrieved from Internet <URL: https://www.formfactor.com/product/probes/infinity /infinity-probe/>.
"High Performance Microwave Probes", Model 40M Low Loss Picoprobe [online], GGB Industries Inc.[retrieved on Sep. 25, 2019], Retrieved from Internet <URL: http://www.ggb.com/40m.html>.
MPI Manual Probe System, photographed during EdiCon 2015 show in Beijing, China.
"On Wafer Load Pull Tuner Setups", Application Note 48, Fig. 6 to 8 and 18, Focus Microwaves, Dec. 2001.
"Conductive EPDM FOAM" [online], Jinan EMI Shielding Technology Co. Ltd.[retrieved on Feb. 19, 2016], Retrieved from Internet <URL: http://www.emishielding.com.cn/product/Conductive-EPDM- FOAM.html>.
"EMI/RFI-shielded glass 9600 series" [online], Holland Shielding Systems BV [retrieved on Feb. 19, 2016], Retrieved from Internet URL:http://hollandshielding.com/231-EMI%20shielded%20glass>.

* cited by examiner

Primary Examiner — Farhana A Hoque

(57) ABSTRACT

A hermetically sealed adjustable link for low loss coaxial airline connection between the seamless connection of coaxial RF connector of external instruments with 30- or 45-degrees wafer probes allows continuous, micro-positioner controlled, 3-axis horizontal and vertical probe movement. A flexible sealing ring ensures airtight and/or RF-EMI shielded operation. A metallic or plastic collar ensures wafer testing under EMI shielded and high temperature conditions.

6 Claims, 16 Drawing Sheets

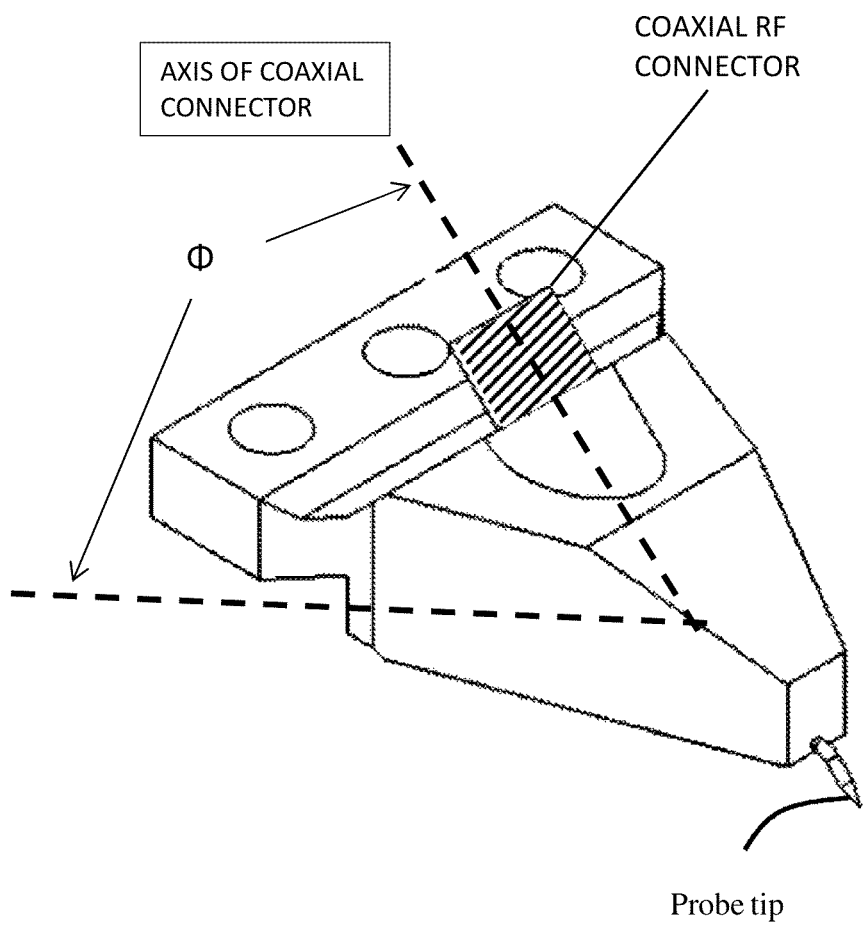
FIG. 1: Prior art

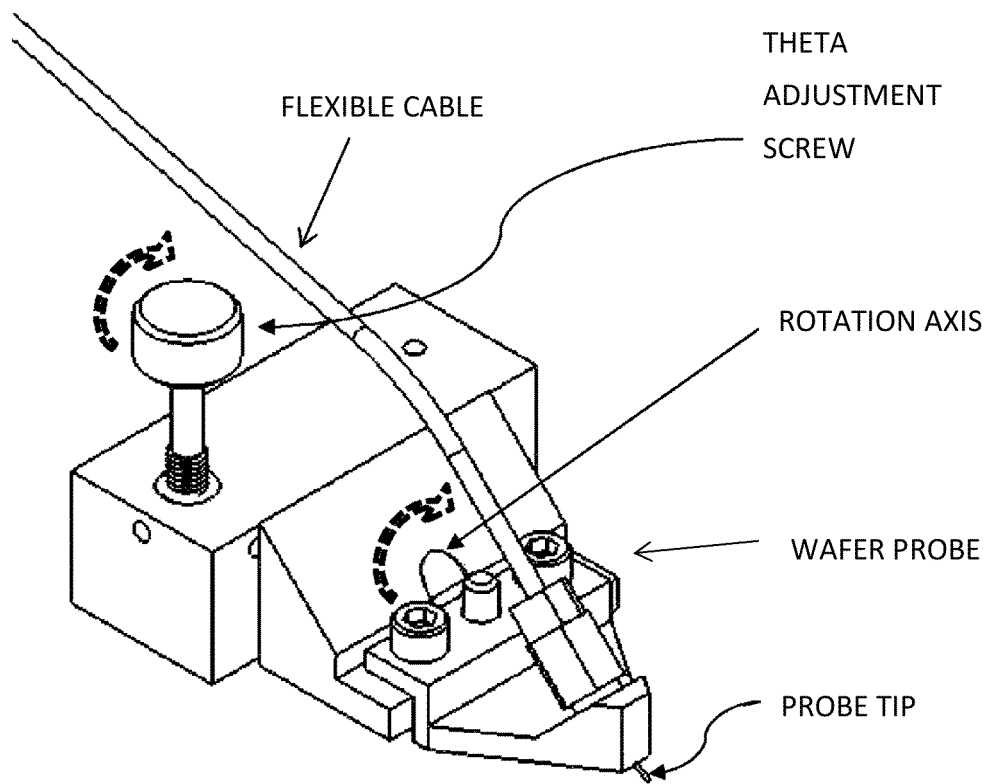
FIG. 2: Prior art

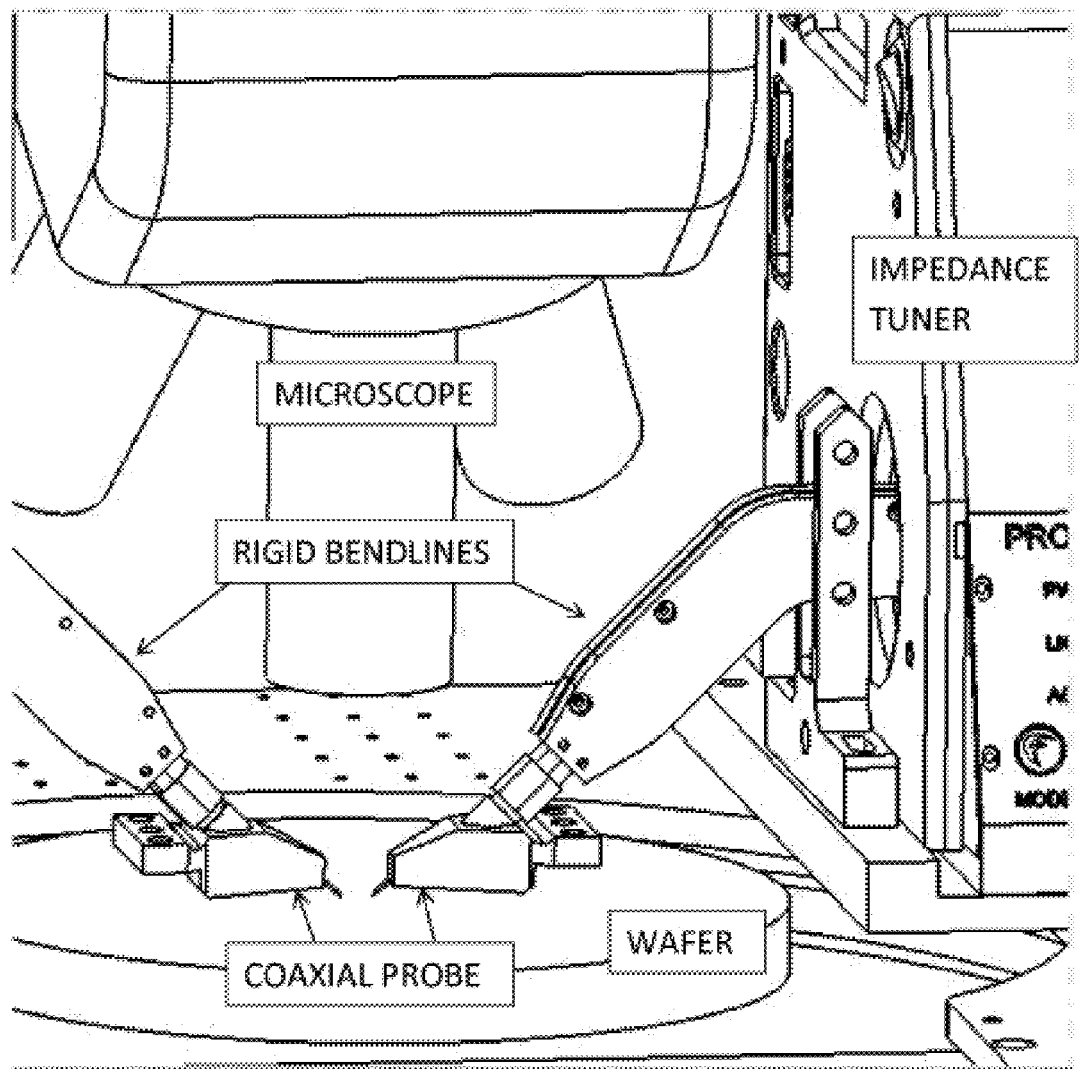
FIG. 3: Prior art

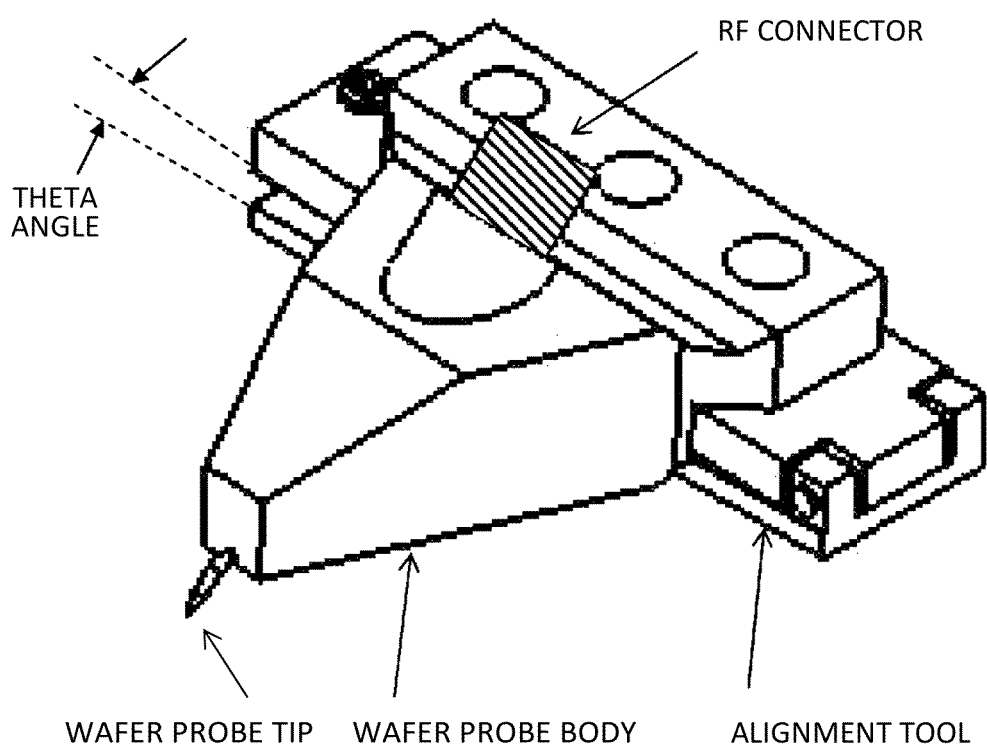
FIG. 4: Prior art

FIG. 5A: Prior art
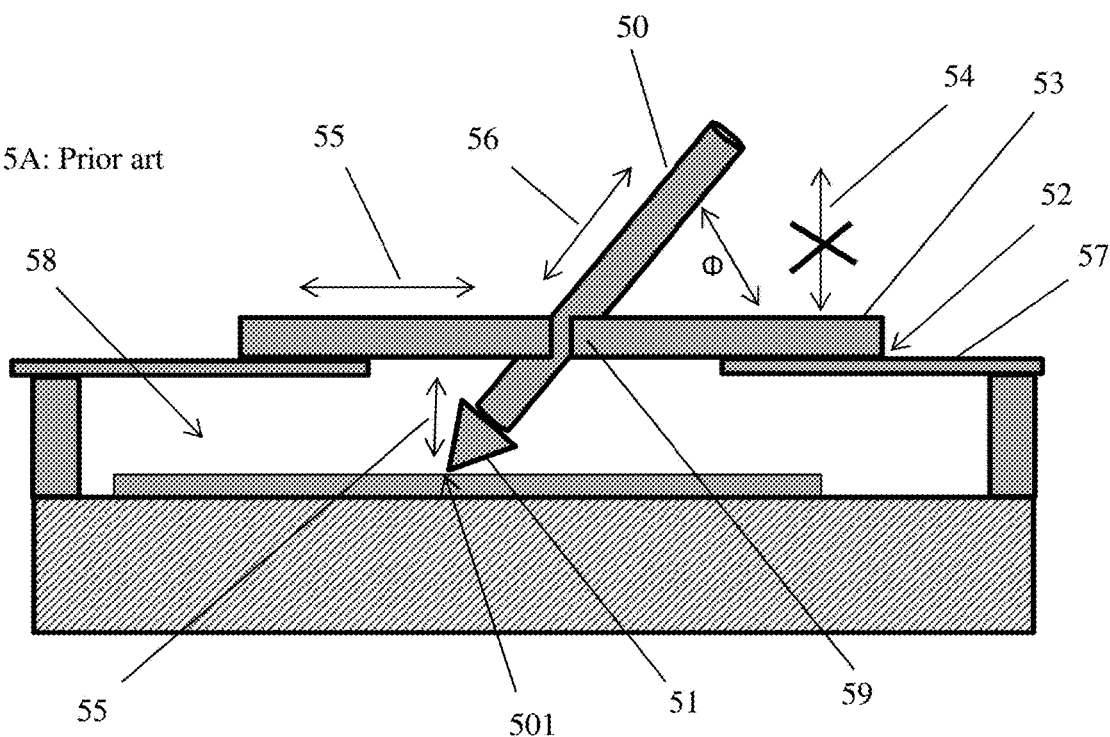
FIG. 5B: Prior art
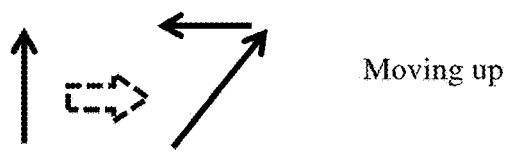 Moving up
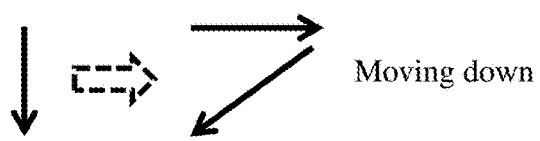 Moving down

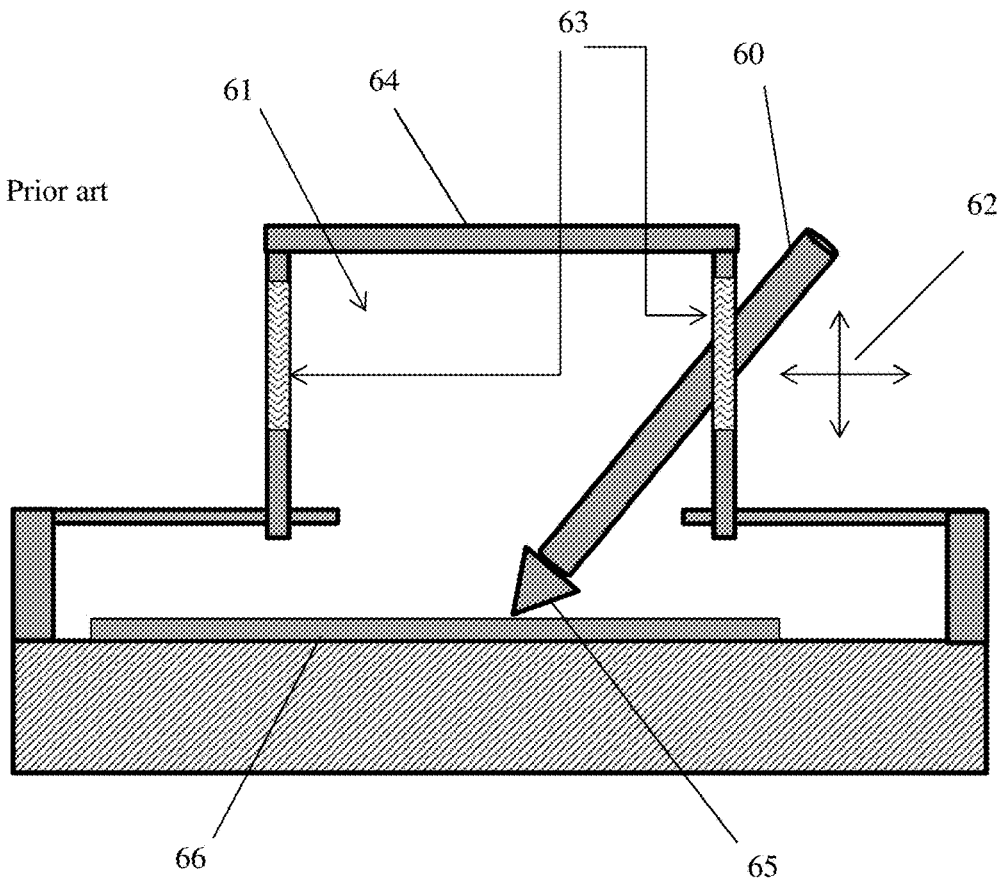
FIG. 6A: Prior art
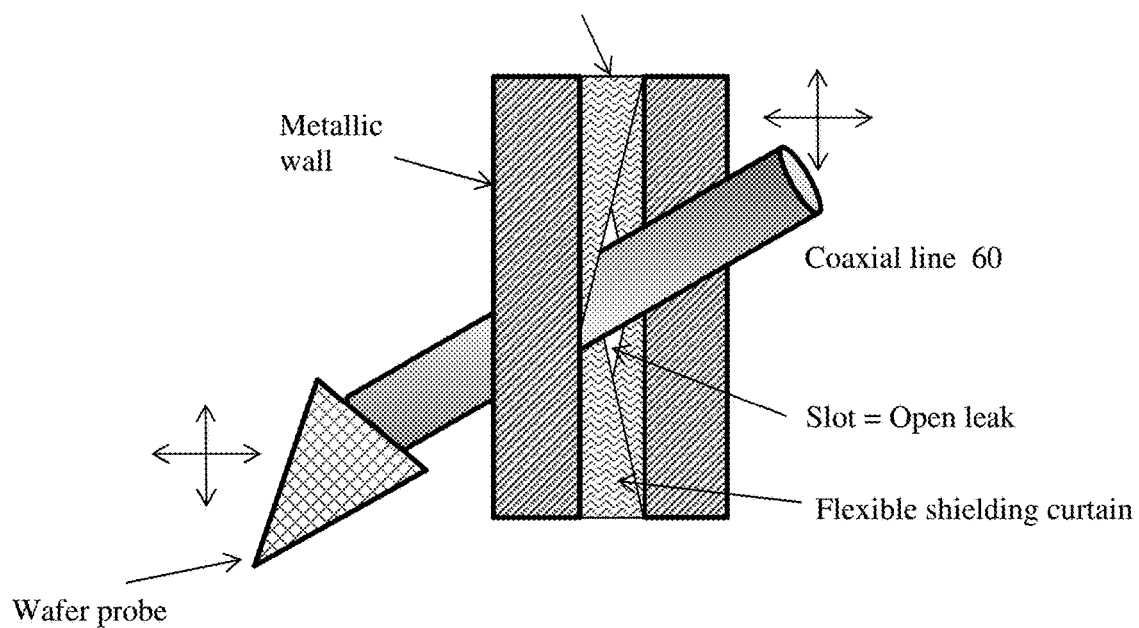
FIG. 6B: Prior art

SHIELDED RF AND THERMAL CONNECTION FOR ON-WAFER LOAD PULL

PRIORITY CLAIM

Not Applicable

CROSS-REFERENCE TO RELATED ARTICLES

1. "High-frequency Performance with Low, Stable Contact Resistance on Aluminum Pads", Infinity probe [online], FormFactor [retrieved on 2019 Sep. 25], Retrieved from Internet <URL: https://www.formfactor.com/product/probes/infinity/infinity-probe/>.
2. "High Performance Microwave Probes", Model 40M Low Loss Picoprobe [online], GGB Industries Inc. [retrieved on 2019 Sep. 25], Retrieved from Internet <URL:http://www.ggb.com/40 m.html>.
3. MPI Manual Probe System, photographed during EdiCon 2015 show in Beijing, China
4. "On Wafer Load Pull Tuner Setups", Application Note 48, FIGS. 6 to 8 and 18, Focus Microwaves, December 2001.
5. Tsironis, U.S. Pat. No. 9,335,345, "A Method for Planarity Alignment of Waveguide Wafer Probes"
6. "Conductive EPDM FOAM" [online], Jinan EMI Shielding Technology Co. Ltd.[retrieved on 2016-02-19], Retrieved from Internet <URL:http://www.emishielding.com.cn/product/Conductive-EPDM-FOAM.html>.
7. "EMI/RFI-shielded glass 9600 series" [online], Holland Shielding Systems BV [retrieved on 2016 Feb. 19], Retrieved from Internet URL:http://hollandshielding.com/231-EMI%20shielded%20glass>.

BACKGROUND OF THE INVENTION

RF and microwave devices and circuits (DUT) are best characterized in chip form "on wafer". This allows eliminating parasitic connection elements, which would falsify the test results. Such are wire bonds and fringe capacitors, which are associated with packaging the devices in order to mount them in test fixtures. It also allows a much larger number of devices to be tested "in situ" without having to laboriously slice the wafer, mount and wire-bond each individual chip. The "on wafer" testing is currently the preferred testing method, except for very high-power devices, beyond (typically) 20 Watt RF power, because of the limitations of the connecting microscopic contacts (wafer probe tips, FIG. 1). On wafer testing is also the exclusive testing method in millimeter-wave frequencies, since device packaging is extremely difficult, and the parasitic elements associated with the package (inductance of wire bonds and fringe capacitors of package housings) would falsify the measured data to the point of uselessness.

Several manufacturers (see ref. 1, 2 and 3) make wafer probes (FIG. 1, 2) capable of reliably testing microwave chips. The microwave probes are made, usually, using small coaxial cables with diameters of the order of 1 mm (0.04"), embedded in a solid body; because of the planar structure of the chips, the coaxial cables of the wafer probes end into a "coplanar" structure, where the center conductor of the coaxial cable becomes the center conductor of the coplanar transmission line and the ground mantle of the coaxial cable ends up as the ground plane of the coplanar line (part of the wafer tip in FIG. 2).

The necessary environmental test conditions for the chips are, typically, either normal (near dust-free) laboratory environment or special, temperature and/or vacuum or EMI radiation-free conditions. To realize those conditions an enclosure (chamber) is needed to shield the wafer on the probe station from the environment. Commercially available solutions to the encapsulation requirement are shown in FIGS. 5 (see ref. 4) and 6 (see ref. 3). In the case of FIG. 6A the shielding is not leak-free, since the RF cable 60 leading into the protective chamber 61, and which is required to move the probe 65 horizontally and vertically 62, in order to make or break the contact with the wafer 66, has to traverse a window 63 on each side of the enclosure 64; the window is filled with a curtain of flexible EMI-shielded material (conductive mesh foam or rubber), which must have a slot (FIG. 6B) for allowing the vertical movement 62 of the cable 60, which creates a leak through the opening and therefore cannot ensure hermetical sealing of the cavity 61. In cases where the access to the wafer probes shall be "low loss" (as is the case in particular for load pull testing) must be at an angle $\Phi$ (typically 30- or 45-degrees) which is the axis of the coaxial connector of the wafer probes (FIG. 1).

The prior art solution of FIGS. 5A and 5B, ensures hermeticity, but, while the RF signal guide 50 reaches the wafer probe 51 at an angle ($\Phi$, typically 30 or 45 degrees) it must also make hermetic, mechanically stable, contact 59 with the cover plate 53 in which case, because the contact 52 between the cavity cover 57 and the movable cover plate 53 must also remain hermetical, a direct vertical movement 54 is impossible: to make or break contact with the chip 501 the probe 51 has to move back and forth 56 and forward-backward 55 as shown in FIGS. 5A and 5B. As shown in FIG. 5B to move the probe to a different chip i.e. lateral and up or down requires a two-step procedure: to move up one must move the probe back first and then left, to move the probe down one must move the probe right first and then forward. In this last case, i.e. in order to establish new contact with the chip, there is increased danger of the probe tips, because they move at an angle, to catch-on and scratch and destroy the chip connection pads. For the left probe the movements are corresponding mirror symmetrical. In either case using the X-Y probe positioners of the probes or of the attached equipment (FIG. 9) require special skill and the contacting process is critical.

BRIEF SUMMARY OF THE INVENTION

This invention introduces a new solution based on an apparatus allowing direct vertical and horizontal movement control of the wafer probe attached to a rigid ultra-low loss RF airline combined with perfect EMI and thermal shielding of the wafer area from the environment; additionally the proposed solution also allows using wafer probes of various angles, as well as a link to either flexible RF coaxial cable or the rigid extended airline of impedance tuners (see ref. 4). The apparatus comprises, alternatively, two types of insulating cylinder: a single-hole cylinder (80 in FIG. 8) and a dual-hole (combo) cylinder (FIG. 16A). The apparatus also includes a cover plate and is shown schematically in cross section in FIG. 7 through 10. Sealing is obtained using rubber pieces in form of O-rings and gaskets. In a detailed layout (FIG. 10) provision is also taken to allow probe Theta angle alignment before closing the cavity (Theta alignment for this application is shown in FIG. 4) by making the cavity cover in two pieces, the bigger one holding the sealing links and the smaller one allowing access to the probes before sealing (104) in FIG. 10.

DESCRIPTION OF THE VARIOUS VIEWS OF THE DRAWINGS

The invention and its mode of operation will be more clearly understood from the following detailed description when read with the appended drawings in which:

FIG. 1 depicts prior art: a microwave wafer probe and wafer probe tip.

FIG. 2 depicts prior art: a wafer probe with micrometric Theta (planarity) alignment mechanism and the probe tip.

FIG. 3 depicts prior art: a complete on-wafer test setup using impedance tuners and rigid extended coaxial airlines between the tuners and the wafer probes.

FIG. 4 depicts prior art: a static Theta alignment mechanism for wafer probes, using and adjustable and removable support and alignment device.

FIG. 5A through 5B depict prior art; FIG. 5A depicts a hermetic wafer test chamber using sloped rigid links between the wafer probe and the test instrument; FIG. 5B depicts the necessary trajectory of the probe movement. A picture of such setup is shown in ref. 3.

FIG. 6A through 6B depict prior art; FIG. 6A depicts and cross section of a shielded wafer test chamber using a cap and shielding curtained slots on the sides to allow traversing the test cable connecting to the probe; FIG. 6B depicts the curtained slot itself and the unavoidable cavity hindering the hermeticity.

Figure 7:
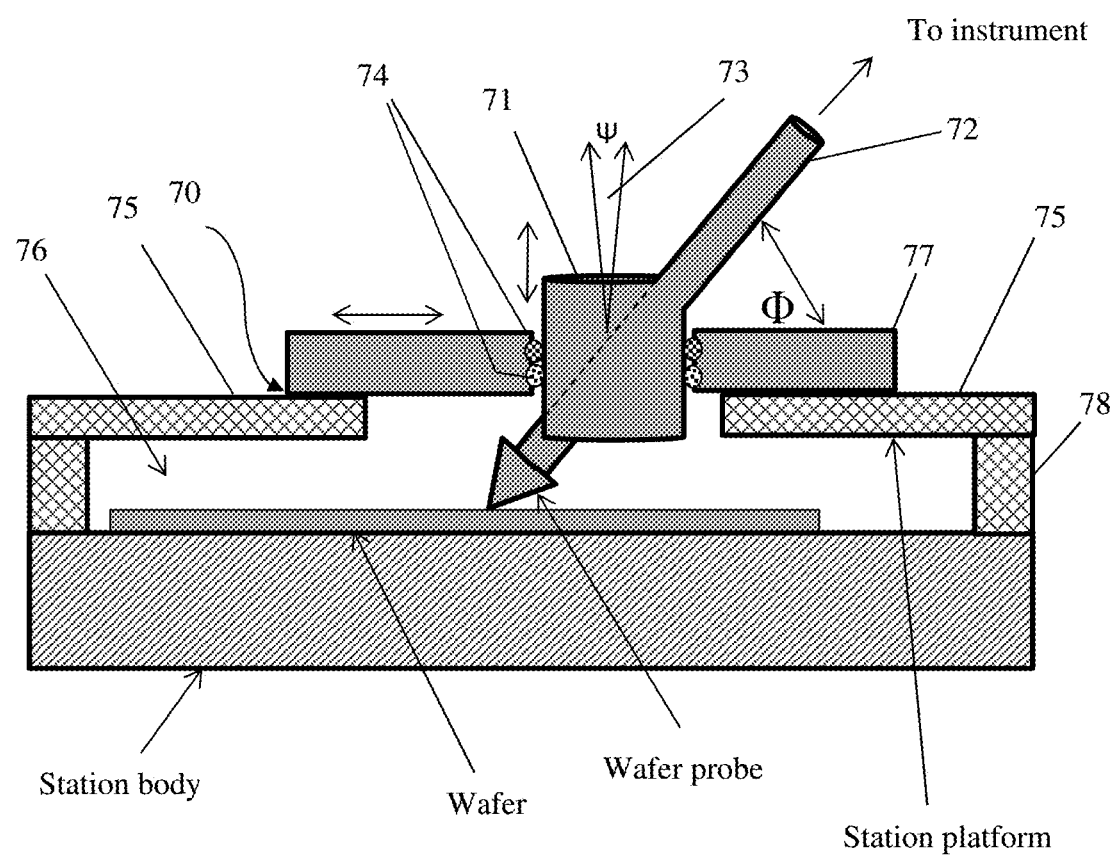

FIG. 7 depicts a RF-EMI and thermally/airtight hermetic wafer test chamber using a vertically and horizontally movable shielded device linking the wafer probe with the test instrument.

Figure 8:
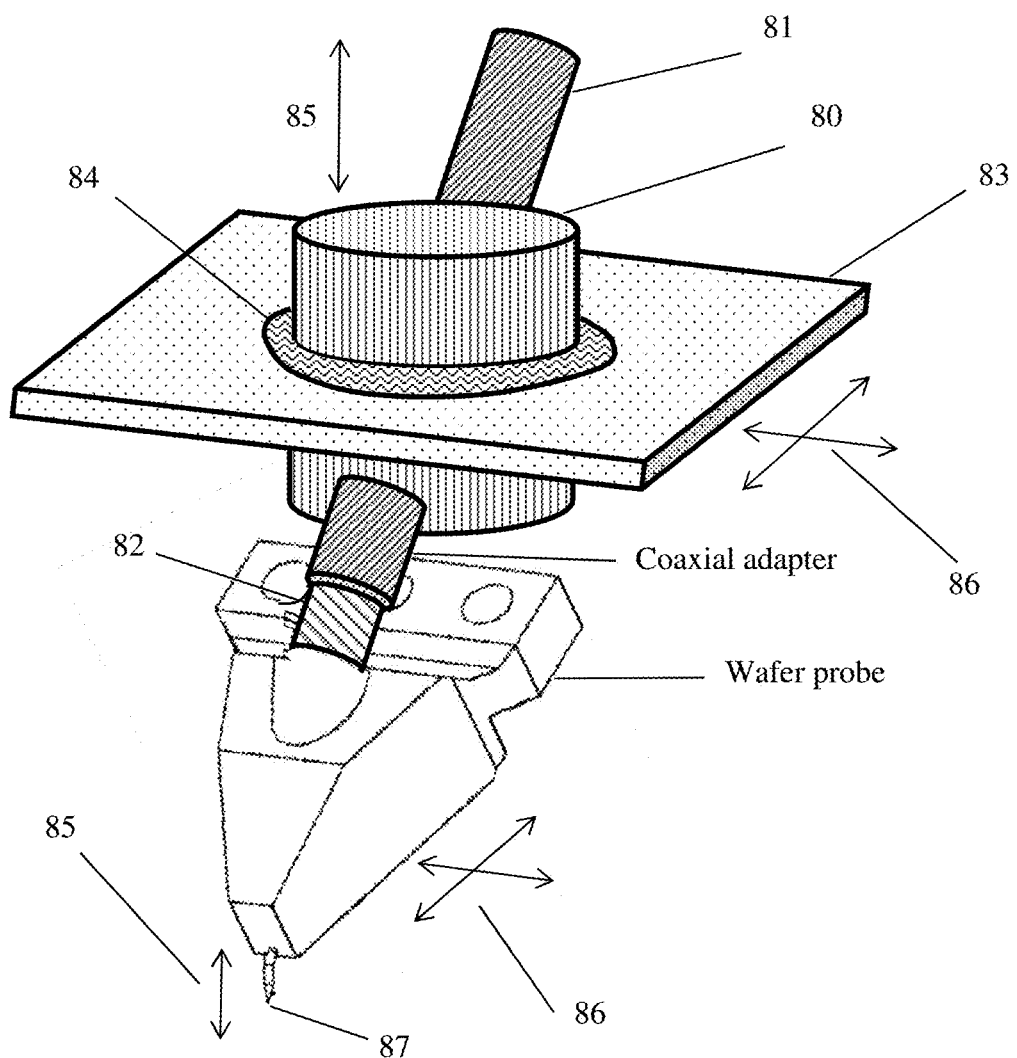

FIG. 8 depicts a 3D view of the shielding link device of FIG. 7.

Figure 9:
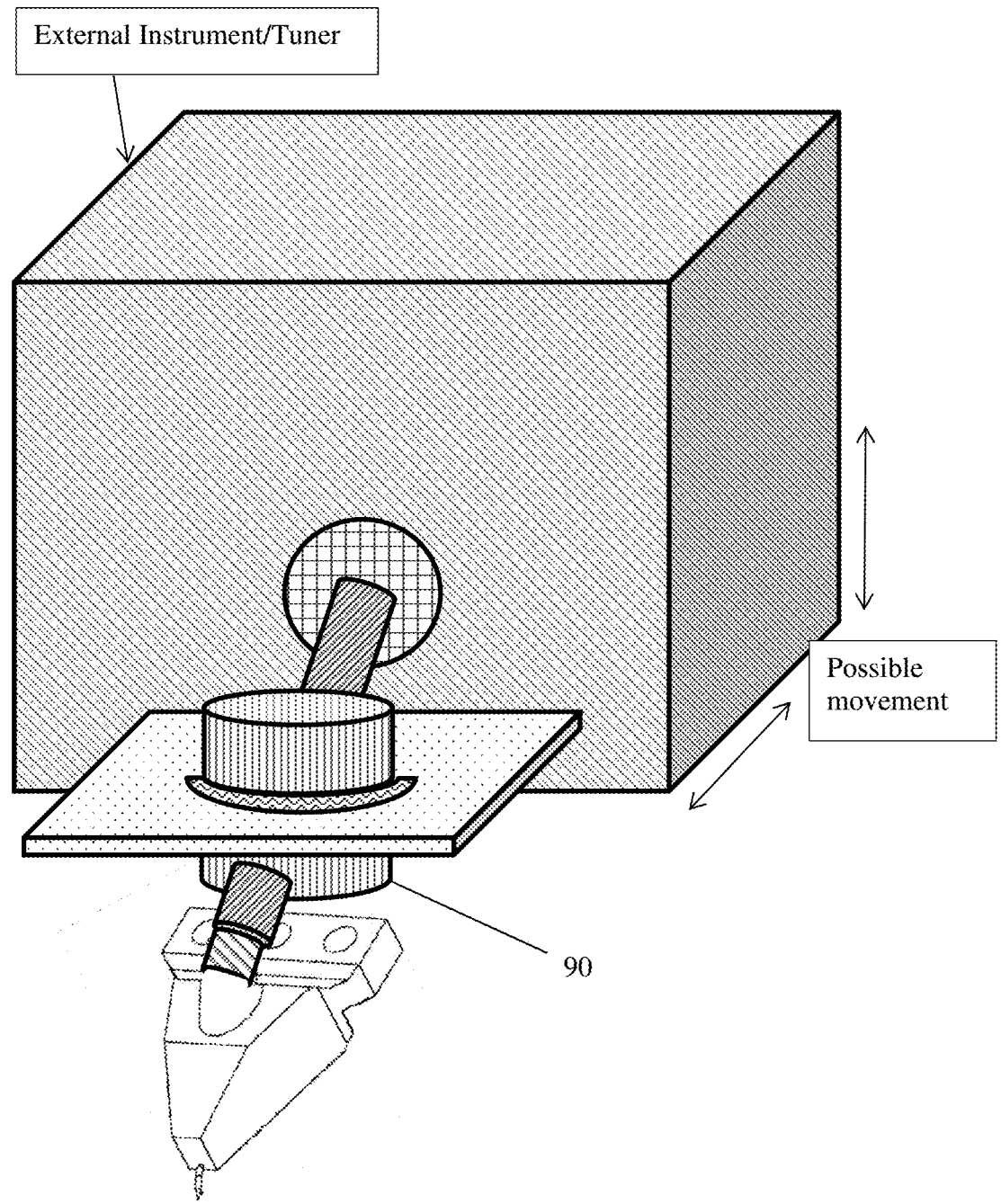

FIG. 9 depicts the complete assembly of the shielding device, the wafer probe and the rigid link to a test instrument (especially beneficial for high reflection electro-mechanical impedance tuner).

Figure 10:
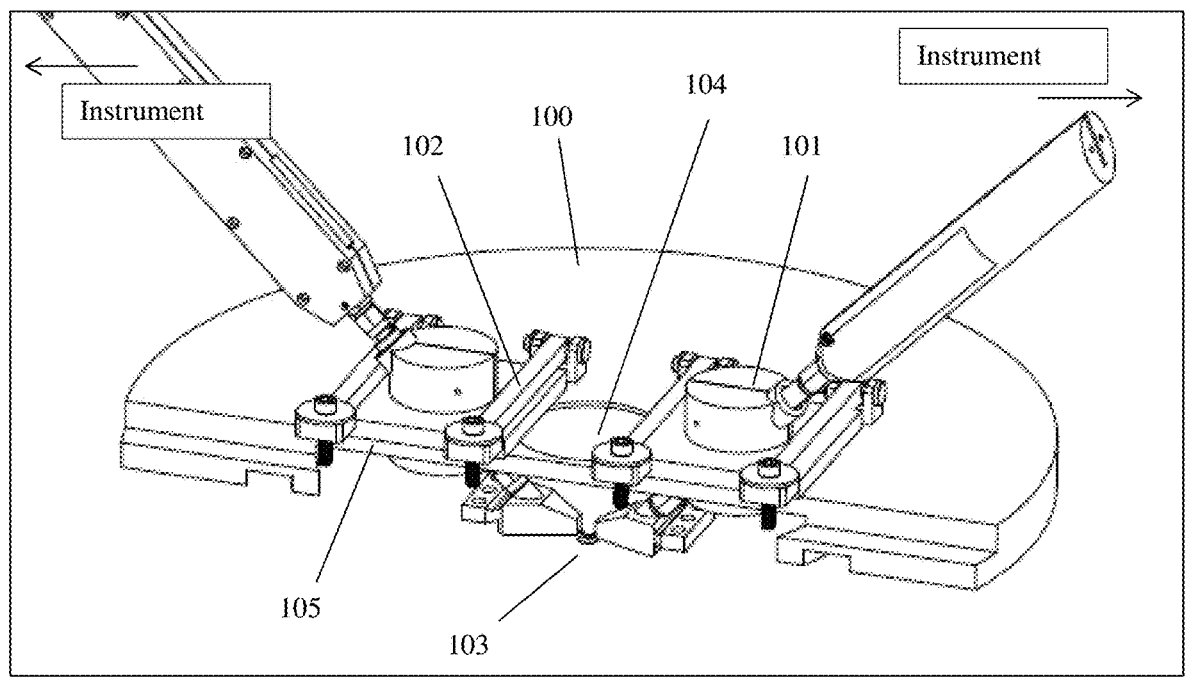

FIG. 10 depicts the 3D view of the complete assembly of the cover plate and two shielding devices for two wafer probes, with one part of the cover plate removed to view the probes and the access to the probes in order to perform Theta alignment.

Figure 11:
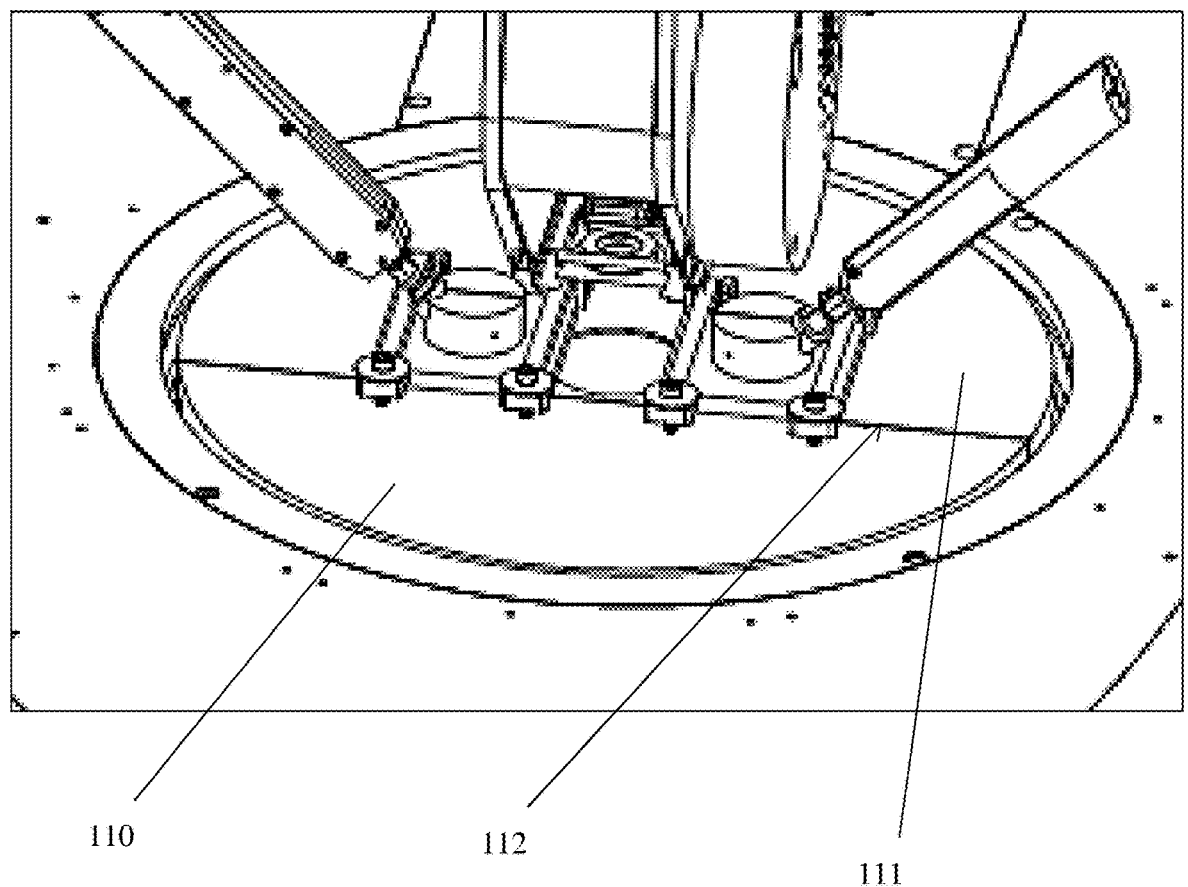

FIG. 11 depicts a 3D view of the shielded probe assembly with all components in place and closed both sections of the cover plate.

Figure 12:
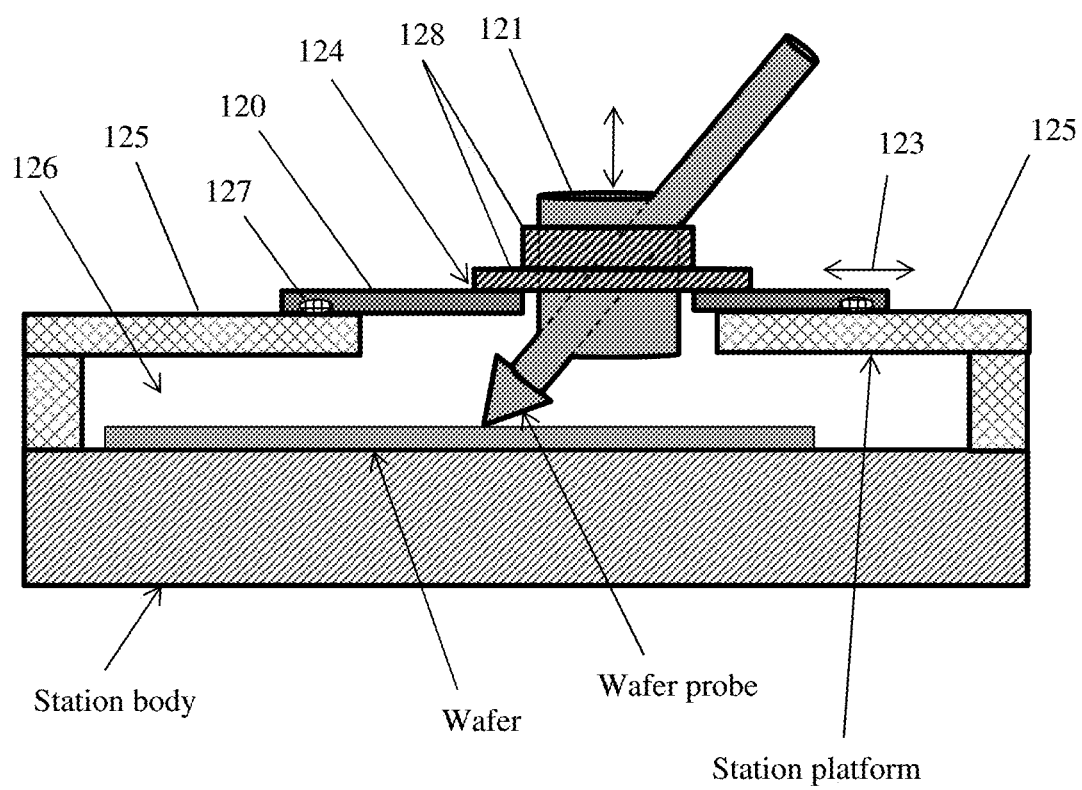

FIG. 12 depicts a cross section view of the shielding link using a collar 128 between the sliding cover plate and the coax line holding cylinder.

Figure 13:
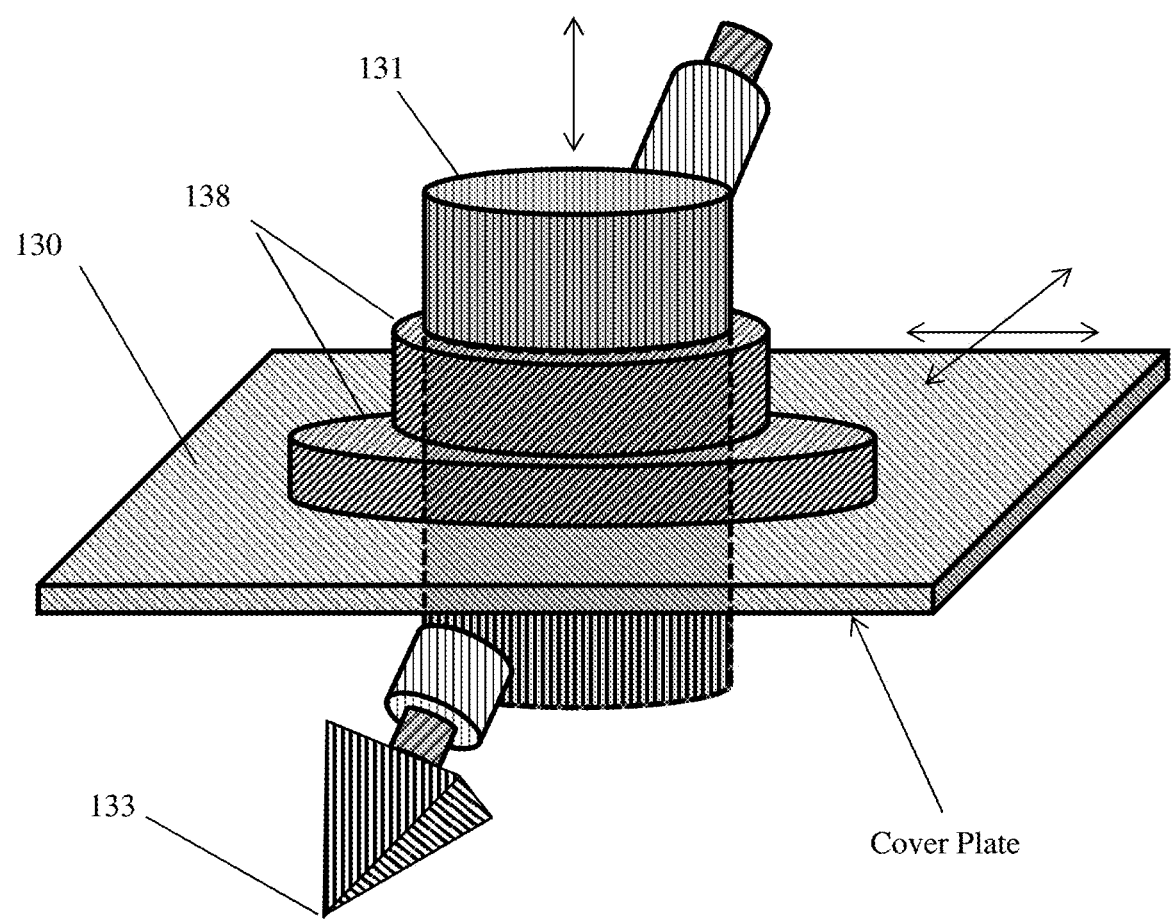

FIG. 13 depicts a detail 3D view of the shielding collar of FIG. 12.

Figure 14:
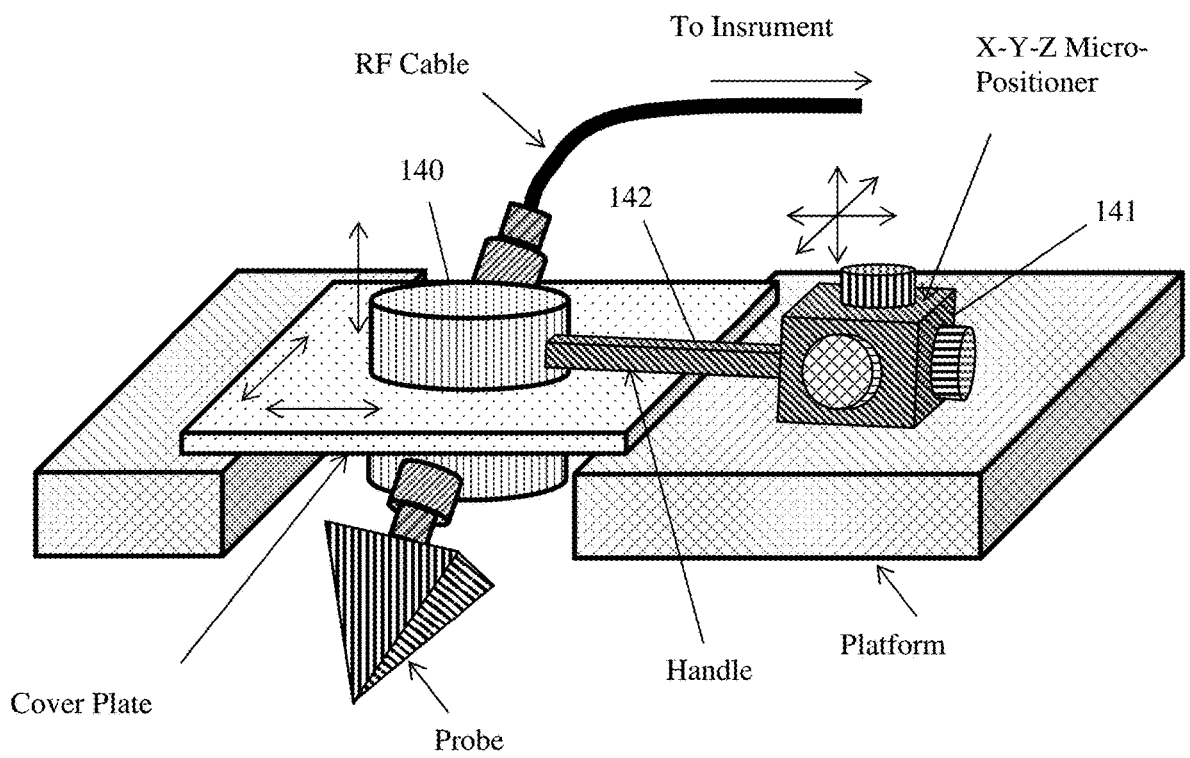

FIG. 14 depicts a 3D view of a setup in which the shielded link is controlled by an external 3 axis (X-Y-Z) micrometric positioner, employable when the probe is connected to the adjacent instrument using a semi-rigid or flexible RF cable.

Figure 15:
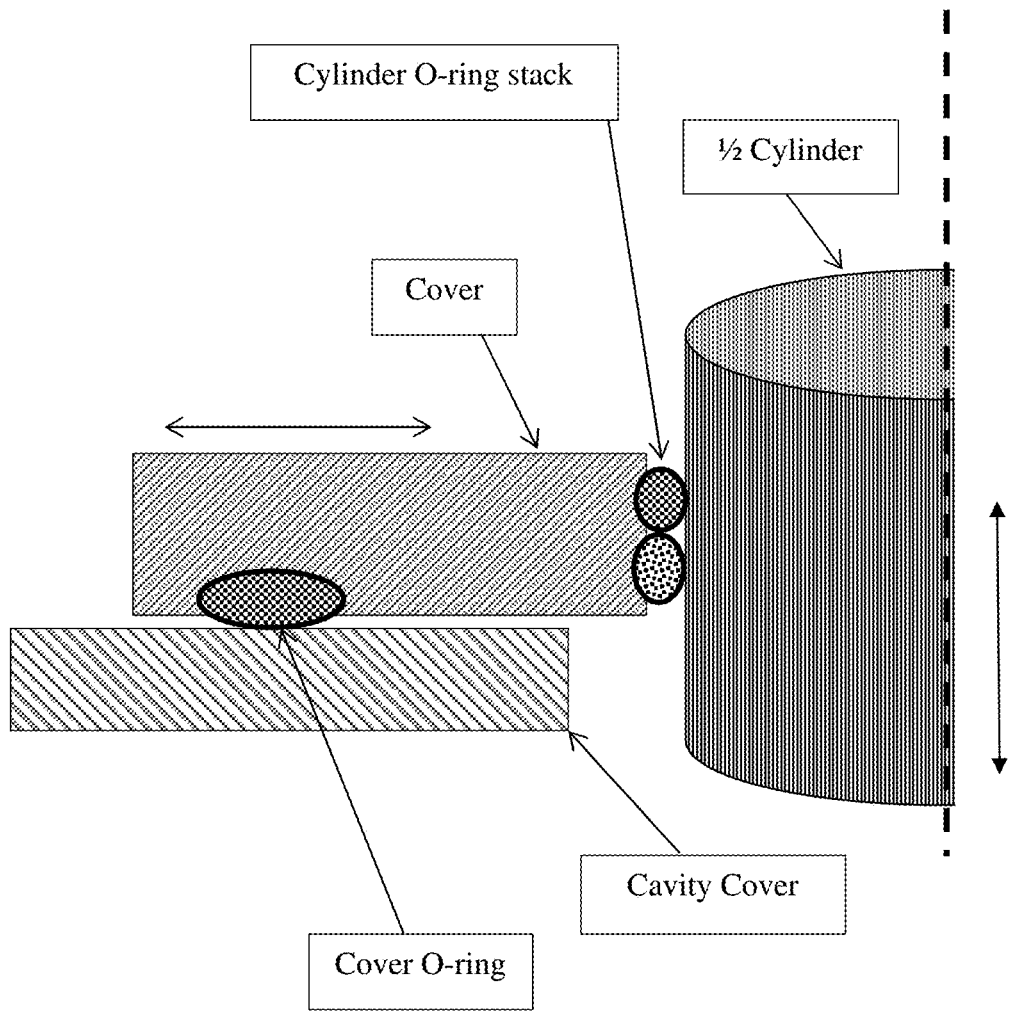

FIG. 15 depicts a view of the horizontal and vertical sealing mechanisms using rubber O-rings, one between the cover and the cavity and one stack between the cover and the vertical cylinder.

Figure 16A:
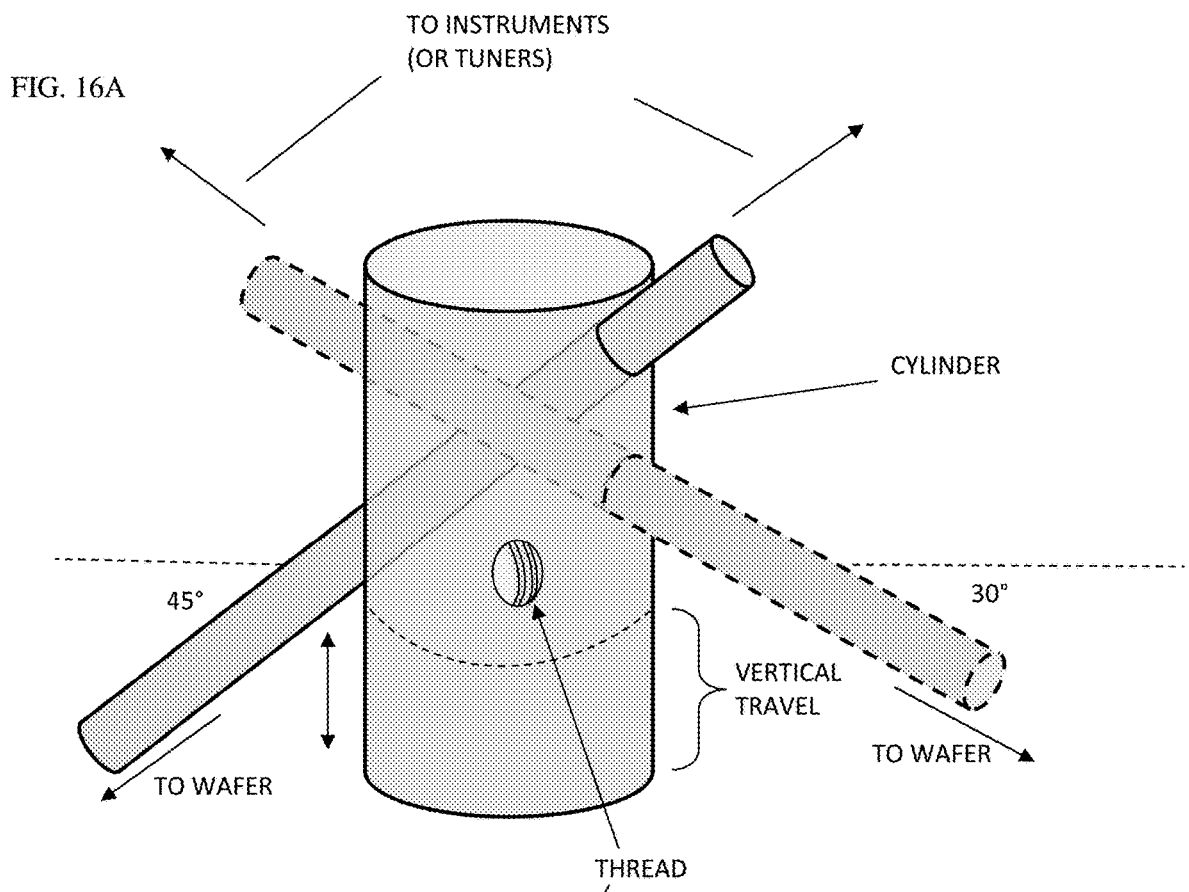
Figure 16B:
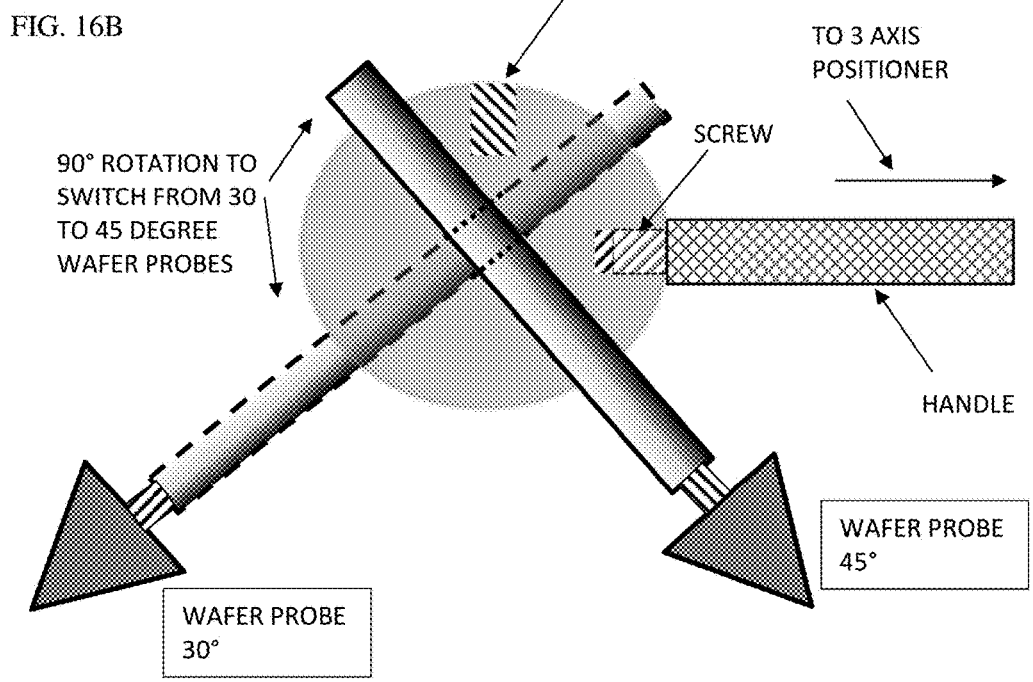

FIG. 16A through 16B depict a dual-hole (combo) vertical cylinder supporting 30° and 45° wafer probes; FIG. 16A depicts a 3D presentation; FIG. 16B depicts a top view. Dotted periphery tubes represent the alternative (30- or 45-degree) configuration method.

DETAILED DESCRIPTION OF THE INVENTION

As explained before, existing solutions for hermetically shielding the cavity surrounding the semiconductor wafer in a wafer probe station are either imperfect (FIG. 6) or impractical to use (FIGS. 5A and 5B). The herein proposed solution cures these shortcomings by using a device, as part of an assembly, which ensures (i) hermetical operation, (ii) normal handling and (iii) compatibility with existing wafer probes and probe stations. The link apparatus includes two main parts: (a) a cover (items 77 in FIG. 7 and 100 in FIG. 10, and (b) an airline/probe holding device (71 and 101 correspondingly). The setup for a complete two-probe setup comprises two of each of the above items, one for each wafer probe. Each probe holding device, shown in FIG. 7, item 71, FIG. 8, item 80, FIG. 9, item 90 and FIG. 10, item 101, comprises a vertical cylinder 80, which can be made of metal or plastic and a hermetically traversing low loss coaxial airline in form of a metallic tube (item 72 in FIG. 7, item 81 in FIG. 8 etc.), which traverses diagonally at a predetermined angle from top to near bottom of the cylinder and forms a straight continuation of the angle of the coaxial connectors attached to the wafer probes (FIGS. 1 and 4 and item 82 in FIG. 8). The coaxial, low loss transmission line serves as a thermally/airtight isolated and RF-EMI sealed link between the wafer probe and external instruments as, in this case, the extended airline of an impedance tuner.

The proposed assembly is best shown in FIGS. 7 and 8. A sloped conductive tube 72, 81 traverses a vertical cylinder 71, 80, which serves as support and vertical guide against the cover plate 77, 83. The cylinder 71, 80 is sealed from the plate 77, 83 using a single combo, or, if not available, a stack of RF-EMI shielding and airtight sealing flexible rubber gaskets or O-rings 74, 84, which are inserted in a peripheral groove inside the edge of the hole in the plate (shown also in cross section as item 74 in FIG. 7). This rubber gasket or O-ring stack 74, 84 is a key element in this setup: it allows sealed vertical 85 sliding of the cylinder 71, 80 against the plate 75, 83, but also small deviations (73 in FIG. 7) from the nominal vertical direction. Such deviations 73 are often un-avoidable in manufacturing non-90 degree angled parts; the prior art solution of FIG. 5A does not tolerate such deviations, since the tube 50 is slide-fitted against the plate 53 and can only slide back and forth at the specific mounting angle 56, while the plate 53 must remain horizontal 55 to make hermetic sliding contact 52 with the cover 57 of the cavity 58.

The cover plate of the new apparatus 77, 83 can slide horizontally in X and Y directions 86 in order to allow the probe tip 87 of the wafer probe to be positioned exactly above the semiconductor chip to be tested. Typically, and in order to ensure perfect sealing, the plates 77, 83 shall, after the final positioning of the probes, be secured with brackets (two pieces 102 per cover plate in FIG. 10). The cover plates 77, 83 must also include a sealing gasket or rubber O-ring 77 between their bottom and the cavity cover 75. The actual position of the probe tips 103 can be observed through the glass window 104 using the microscope shown in FIG. 3. Once the probe tip 87 is positioned close above the chip to be tested, the cover plate 100 is secured (immobilized) using the brackets 102.

Special attention is to be paid to the items 74, 84 in FIG. 7, 8. They have been described above as rubber O-rings. This, however, is only one alternative. This joint is a critical item in the setup. It is a preferred alternative to a rigid metal-on-metal connection (area 59 in FIG. 5A), which would not allow for any manufacturing-caused misalignment 73. This joint 74, 84 must be hermetical. Again, there are two types of hermeticity: (a) liquid/gas hermeticity and (b) RF-EMI (EMI="Electro-Magnetic-Interference") shielding. In the first case a rubber or Teflon shield in form of an O-ring will be enough. In the second case a rubber joint enveloped in a conductive mesh, commercially available under the brand name "EMI shielding gasket or foam" is required (see ref. 6). In case both gas and RF shielding are required the joint should be a stacked combination 74 of both, arranged around the cylinder 71, 80. In case only gas hermeticity (no RF-EMI) of the cavity 76 is required, the cylinder 80, 71 could be made of polished plastic or Teflon, for better sliding capacity against the O-ring. In either case both, vertical travel distance and angle misalignment are expected to be small. Vertical travel in the order of 10 millimeters (or less) and angle "Φ" misalignment of typically less than 5 degrees versus the standard 30 or 45 degrees of the wafer probes shall suffice.

An alternative embodiment, most suitable for high temperature and EMI-shielded operation is shown in FIG. 12. In this case the flexible O-ring 74 is replaced by a concentric rigid collar 128. This collar is attached permanently 124 on the mobile 123 cover plate 120, which itself is shielded against the station cover 125 using rubber or EMI-gaskets 127 as in the previous embodiment, or, if incompatible with the high temperature, direct sealed metal-on-metal contact. Once the probe tip, 130 in FIG. 13, is positioned close above the chip to be tested, the cover plate 120 (FIG. 12), 130 (FIG. 13) is secured (immobilized) using the brackets 102 (FIG. 10). The cylinder 121 can then slide vertically inside the collar 128, but, contrary to the embodiment of FIG. 7, the cylinder cannot tolerate mounting angle imperfections 73. The collar 128 can be made of conducting metal (brass, copper, aluminum etc.) for EMI shielding and high temperature operation in the cavity 126. If the major concern is gas hermeticity at low or medium temperature operation, the collar 128 can be made of plastic material, preferably Teflon, because of its good sliding and shielding properties.

A representative 3D view of the embodiment of the link using a collar shielding device instead of a flexible O-ring is shown in FIG. 13. The collar 128 (FIG. 12), 138 (FIG. 13) can, obviously, be either permanently fixed on the cover 120, 130 or made as part of a single piece with the cover 120, 130, since the cover 120, 130 ensures horizontal mobility over the underlying station cover 125, while ensuring vertical mobility against the cylinder 131 and precise control of the probe tip 133.

Hermeticity shall also be ensured between the cover plate (item 83 in FIG. 8 and item 77 in FIG. 7) and the top cover of the station 75. This can be ensured using embedded rubber, conductive EMI, Teflon or rubber O-rings, or a stacked combination of those 77. The window 104 can also be RF shielded when covered with a RF shielding transparent layer or EMI shielded glass (see ref. 7). Details of such an embodiment are shown in FIG. 15.

FIG. 16A, 16B depicts a combo cylinder. A combo cylinder allows using 30- or 45-degree wafer probes by just repositioning the airline. In either case hermeticity must be ensured. That is, when the airline is inserted into the 45-degree hole, the 30-degree hole must be plugged and sealed from the outside and vice versa, since sealing from the inside may be impractical. Employing two airlines simultaneously is possible but not necessary and risks complicating the positioning of the wafer probes.

In case the wafer probes are to be connected to the external instruments using flexible RF cables (FIG. 14) the sealed cylindrical holder 140 shall be controlled by a small external 3-axis (X-Y-Z) micro-positioner 141 through a rigid connection handle 142, which is firmly attached to the cylinder 140 and the micro-positioner 141. The 3-axis positioner itself is mounted independently on the wafer probe station platform. In the case of an impedance tuner, of which the test port, for minimizing insertion loss and maximizing the tuning range, is connected directly to the airline 72, see also FIG. 9, the hermetic link is not controlled independently by the handle and the 3 axis positioner; instead the whole assembly link and tuner is controlled by a stronger 3-axis tuner positioner. The fact that the insertion loss, to be minimized, increases with frequency coincides conveniently with the fact that the tuners become smaller and lighter at higher frequencies, and easier to handle by medium size tuner positioners.

Theta (planarity) alignment is important for wafer probes. FIG. 2 shows a prior art device which allows such continuous rotation alignment. Such in-situ operational capacity of the hermetic link itself is, however, not required, since the probes must be aligned only once. Nonetheless any practical apparatus, including this invention, shall offer the possibility of a one-off Theta alignment. The prior art mechanism of doing so is shown in FIG. 4; it comprises an "alignment tool" which is inserted beneath the probe body and the bottom plate of the probe station, the probe is pressed against it (without semiconductor wafer in place and without the tips touching the wafer plate, obviously) and the coaxial connector is tightened (see ref. 5). To enable connector tightening in situ with the probe holding device in place, the disc-formed cover plate 75, 100 must be made in two pieces: one piece being approximately ⅗ of the plate surface, as shown in FIG. 10, contains the glass window 104 and openings for the support plates 105; and one piece covering the remaining ⅖ of the disc which is tightened also against the station plate 78 to ensure hermeticity. Hermeticity between the two sections 110 and 111 of the cover disk plate 100 is ensured also using a straight rubber or EMI shielding gasket at the joint 112.

The present invention has been disclosed hereby in the form of several preferred embodiments. Obvious alternatives are imaginable but shall not be construed to trespass on the basic idea of using a dedicated hermetical cylindrical device holding the coaxial line allowing easy 3-axial man-handling and micro-positioning wafer probes in a wafer probe station environment.

What I claim is:

1. A X-Y-Z adjustable, RF-EMI hermetically shielded, low RF loss combo link, as part of a RF-EMI isolated chamber of a wafer test station, allowing connecting test equipment with two types of wafer probes, a 30-degree wafer probe and a 45-degree wafer probe, comprises:
    a vertical cylinder with two, perpendicular to each-other non-intersecting, cross-over holes,
    a section of low loss coaxial airline, and
    a cover plate shielding an opening in a top cover of the RF-EMI isolated chamber;
wherein
    the cross-over holes traverse the vertical cylinder diametrically from near the top to near the bottom of a periphery of the vertical cylinder, one hole traversing at 30-degree angle and the other hole traversing at 45-degree angle, each said hole allowing the coaxial airline to slide-fit inside;
and wherein
    the vertical cylinder slide-fits and slides inside a hole in the cover plate of the top cover of the RF-EMI isolated chamber;
and wherein
    all sliding contacts are hermetically RF-EMI shielded.

2. The RF-EMI hermetically shielded, low-loss combo link of claim 1, wherein the test equipment are load-pull impedance tuners.

3. The RF-EMI hermetically shielded, low-loss combo link of claim 1,
wherein
the vertical cylinder slide-fits and slides inside a surrounding collar, which is mounted on a secondary plate attached to the cover plate.

4. The RF-EMI hermetically shielded, low-loss combo link of claim 1,
wherein
the vertical cylinder slide-fits and slides inside a stack of two O-rings: a RF-EMI shielding O-ring and an airtight flexible O-ring, which are inserted between the vertical cylinder and the internal rim of the hole in the cover plate.

5. The RF-EMI hermetically shielded, low-loss combo link of claim 1,
wherein
the cover plate slides on a RF-EMI-shielding hermetic gasket inserted between the bottom of the cover plate and the underlying top cover of the chamber.

6. The RF-EMI hermetically shielded, low-loss combo link as in claim 1,
wherein
the vertical cylinder is controlled by an external 3-axis (X-Y-Z) micro-positioner, which is anchored on a platform of the wafer test station.

\* \* \* \* \*